(12) United States Patent
Yamamoto et al.

(10) Patent No.: US 10,094,883 B2
(45) Date of Patent: Oct. 9, 2018

(54) VOLTAGE DETECTING DEVICE AND BATTERY PACK MONITORING SYSTEM

(71) Applicant: DENSO CORPORATION, Kariya, Aichi-pref. (JP)

(72) Inventors: Shunya Yamamoto, Kariya (JP); Kazutaka Honda, Kariya (JP); Yukihiro Tomonaga, Kariya (JP); Ryotaro Miura, Kariya (JP)

(73) Assignee: DENSO CORPORATION, Kariya (JP)

( * ) Notice: Subject to any disclaimer, the term of this patent is extended or adjusted under 35 U.S.C. 154(b) by 142 days.

(21) Appl. No.: 15/378,271

(22) Filed: Dec. 14, 2016

(65) Prior Publication Data

US 2017/0322261 A1 Nov. 9, 2017

(30) Foreign Application Priority Data

May 9, 2016 (JP) .................................. 2016-93793

(51) Int. Cl.
| | |
|---|---|
| *G01N 27/416* | (2006.01) |
| *G01R 31/36* | (2006.01) |
| *G01R 22/00* | (2006.01) |
| *G01R 13/38* | (2006.01) |
| *G01R 11/46* | (2006.01) |
| *G01R 23/00* | (2006.01) |
| *H01Q 1/22* | (2006.01) |

(52) U.S. Cl.
CPC ........ *G01R 31/3658* (2013.01); *G01R 11/465* (2013.01); *G01R 13/38* (2013.01); *G01R 22/00* (2013.01); *G01R 23/005* (2013.01); *H01Q 1/2233* (2013.01)

(58) Field of Classification Search
CPC .. G01R 31/3658; G01R 11/465; G01R 22/00; G01R 13/38; G01R 23/005; H01Q 1/2233
USPC .................................................. 324/425–437
See application file for complete search history.

(56) References Cited

U.S. PATENT DOCUMENTS

| | | | |
|---|---|---|---|
| 5,617,093 | A | 4/1997 | Klein |
| 7,944,288 | B2 | 5/2011 | Ummelmann |
| 2002/0195996 | A1 | 12/2002 | Nakatsuji |
| 2008/0150516 | A1 | 6/2008 | Yonezawa |

(Continued)

FOREIGN PATENT DOCUMENTS

| | | |
|---|---|---|
| EP | 2 520 942 A2 | 11/2012 |
| JP | 05-076140 A | 3/1993 |

*Primary Examiner* — Jermele M Hollington
*Assistant Examiner* — Raul Rios Russo
(74) *Attorney, Agent, or Firm* — Posz Law Group, PLC

(57) ABSTRACT

A voltage detecting device detects a differential voltage between two input nodes having a non-zero common mode voltage. A differential voltage detecting circuit 5 detects the differential voltage by sampling each voltage of the input nodes and outputs a detection voltage indicating a detection result. A leak canceling circuit generates a compensating current, which flows in opposition to a leak current flowing out from the input nodes in correspondence to an operation of the differential voltage detecting circuit. An operation control part controls the leak canceling circuit to perform or stop a canceling operation. A failure diagnosing part performs a failure diagnosis about the leak canceling circuit based on a first detection value and a second detection value of the detection voltages, which are detected during periods when the leak canceling circuit performs and stops the canceling operation.

12 Claims, 10 Drawing Sheets

(56) References Cited

U.S. PATENT DOCUMENTS

| | | |
|---|---|---|
| 2010/0079204 A1 | 4/2010 | Ummelmann |
| 2012/0250203 A1* | 10/2012 | Makihara ............. G01R 31/362 |
| | | 361/86 |
| 2012/0274360 A1 | 11/2012 | Kultgen et al. |
| 2016/0276990 A1* | 9/2016 | Aoyama ............. H03F 3/45475 |
| 2017/0254854 A1* | 9/2017 | Honda ................. G01R 31/362 |

* cited by examiner

VOLTAGE DETECTING DEVICE AND BATTERY PACK MONITORING SYSTEM

CROSS REFERENCE TO RELATED APPLICATION

This application is based on Japanese patent application No. 2016-93793 filed on May 9, 2016, the whole contents of which are incorporated herein.

FIELD

The present disclosure relates to a voltage detecting device, which detects a differential voltage between two input nodes and a battery pack monitoring system.

BACKGROUND

A high-precision A/D converter such as a delta-sigma ($\Delta\Sigma$) type A/D converter is used to detect a battery voltage. The $\Delta\Sigma$-type converter necessitates over-sampling. For this reason, a capacitor is charged and discharged repetitively at a relatively short period and hence a leak current flows out from the battery, the voltage of which is to be detected. A system for detecting the battery voltage is provided with a low-pass filter at its input stage. The low-pass filter is formed of a capacitor and a resistor having a relatively high resistance value. The leak current from the battery flows to the resistor of the filter and causes a voltage drop. This voltage drop is not negligible relative to a detection value of the voltage and causes a detection error.

US 2012/0274360A therefore proposes a compensating circuit (referred to as a leak canceling circuit below), which generates a compensating current flowing in opposition to the leak current. The compensating current cancels out the leak current thereby to reduce the detection error caused by the voltage drop generated by the resistor in the filter.

In case that the leak canceling circuit fails to operate property, not only the detection precision is lowered but also the detection value may deviate very much from a normal detection case in a worst case. Such a deviation in the detection value will tend to cause erroneous operations in various processing, which use the voltage detection value.

SUMMARY

The present disclosure addresses the above-described problem and has an object to provide a voltage detecting device and a battery pack monitoring system, which improve a voltage detection precision.

According to one aspect, a voltage detecting device is provided for detecting a differential voltage between two input nodes having a common mode voltage, which is not zero. The voltage detecting device comprises a differential voltage detecting circuit, a leak canceling circuit, an operation control part and a failure diagnosing part. The differential voltage detecting circuit detects the differential voltage by sampling each voltage of the two input nodes and outputs a detection voltage indicating a detection result. The leak canceling circuit generates a compensating current, which flows in an opposite direction to a leak current leaking from two input node sides due to an operation of the differential voltage detecting circuit. The operation control part controls the leak cancelling circuit to perform or stop a leak cancelling operation. The failure diagnosing part performs a failure diagnosis about the leak canceling circuit based on a difference between a first detection value and a second detection value. The first detection value and the second detection value indicate values of the detection voltages detected in periods, during which the leak canceling circuit is controlled to perform and stop the leak canceling operation, respectively.

According to another aspect, a voltage detecting device is provided for detecting a differential voltage between two input nodes having a common mode voltage, which is not zero. The voltage detecting device comprises a differential voltage detecting circuit, a leak canceling circuit, an inspection voltage application part and a failure diagnosing part. The differential voltage detecting circuit detects the differential voltage by sampling each voltage of the two input nodes and for outputting a detection voltage indicating a detection result. The leak canceling circuit generates a compensating current, which flows in an opposite direction to a leak current leaking from two input node sides due to an operation of the differential voltage detecting circuit. The inspection voltage application part applies a predetermined inspection voltage between the input nodes. The failure diagnosing part for performs a failure diagnosis about the leak canceling circuit based on a value of the detection voltage detected in a period, during which the inspection voltage is applied between the input nodes.

DETAILED DESCRIPTION OF THE EMBODIMENT

A voltage detecting device and a battery pack monitoring system will be described below with reference to the draw-

First Embodiment

A first embodiment of a voltage detecting device will be described with reference to FIG. 1 to FIG. 6.

Figure 1:
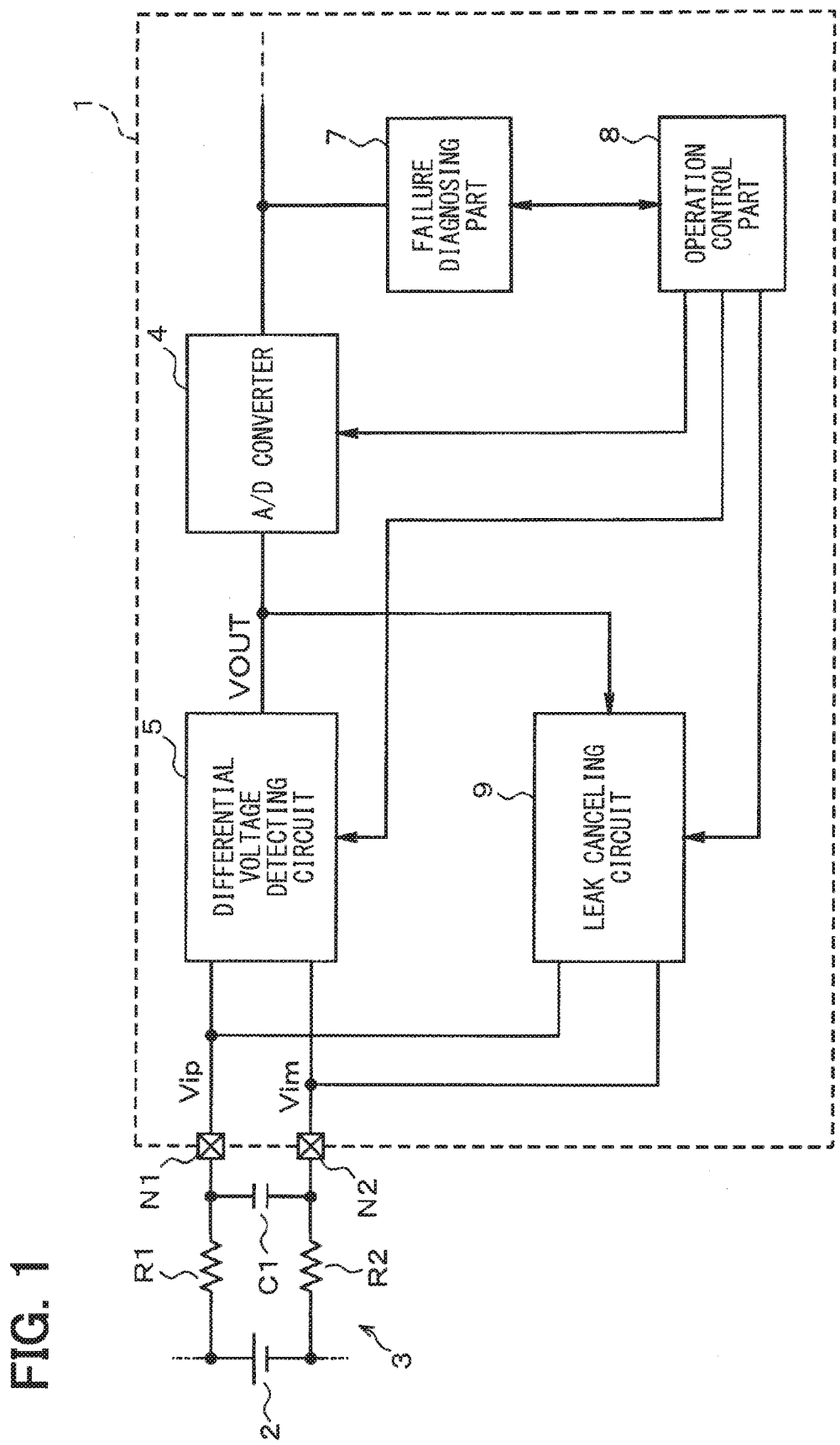
FIG. 1 is a block diagram schematically showing a general configuration of a voltage detecting device according to a first embodiment.

As shown in FIG. 1, a voltage detecting device 1 detects a differential voltage ΔVi between a voltage Vip of an input node N1 and a voltage Vim of an input node N2. The input node N1 is connected to a high-potential side terminal of a battery cell 2 of a battery pack (not shown) through a resistor R1. The input node N2 is connected to a low-potential side terminal of the battery cell 2 through a resistor R2. A capacitor C1 is connected between the input nodes N1 and N2. The capacitor C1 forms an RC filter 3 jointly with the resistors R1 and R2 for filtering out noises. The voltage detecting device 1 is integrated in one integrated circuit (IC) chip together with other circuits such as an A/D converter 4. The A/D converter 4 is, for example, a ΔΣ-type, which is capable of detecting the voltage of the battery cell 2 with high precision.

The battery cell 2 is connected in series with other battery cells (not shown) in multiple stages to form a battery pack. For this reason, a common mode voltage is superimposed on the battery cell 2. This common mode voltage increases as the battery cell is connected at a higher stage side, that is, at a higher potential side, of the battery pack. The common mode voltage superimposed on the battery cell 2 is, for example, several hundreds of volts.

Figure 2:
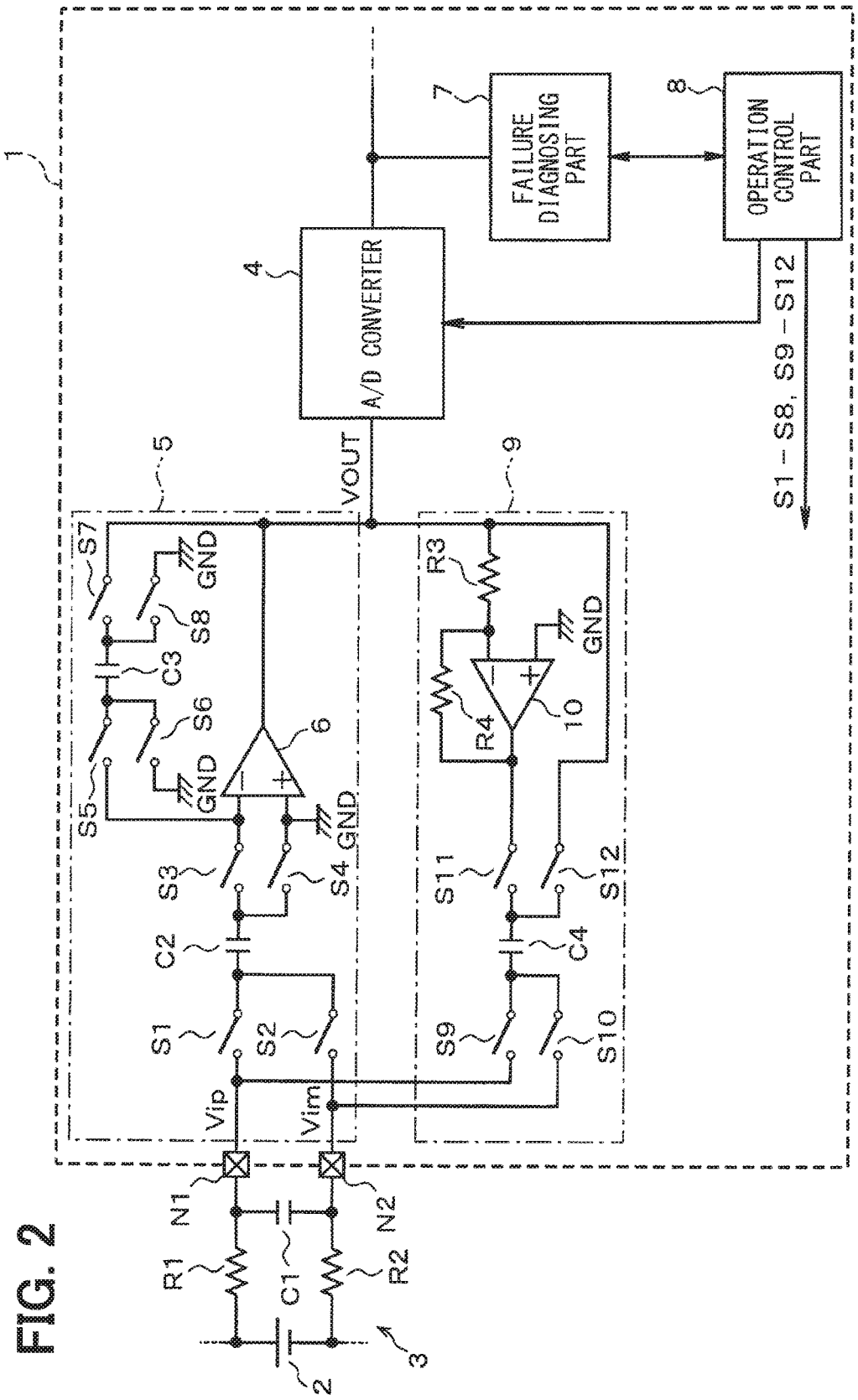
FIG. 2 is a circuit diagram showing a detailed configuration of a differential voltage detecting circuit and a leak canceling circuit.

A differential voltage detecting circuit 5 detects the differential voltage ΔVi by sampling the voltages Vip and Vim of the input nodes N1 and N2. The differential voltage detecting circuit 5 may be in a single end configuration, for example, which includes as shown in FIG. 2 an operational amplifier 6, capacitors C2 and C3, and switches S1 to S8.

The operational amplifier 6 outputs from its output terminal a detected voltage VOUT, which indicates a detection result of the differential voltage ΔVi. The detection voltage VOUT is converted into a digital data by the A/D converter 4. This digital data, which indicates a detection value of the differential voltage ΔVi, is applied to a failure diagnosing part 7 and used by control apparatuses (not shown) of higher levels.

One end of the capacitor C2 is connected to the input node N1 through the switch S1 and to the input node N2 through the switch S2. The other end of the capacitor 2 is connected to an inverting input terminal of the operational amplifier 6 through the switch S3 and to a non-inverting input terminal of the operational amplifier 6 through the switch S4. The inverting input terminal of the operational amplifier 6 is connected to one end of the capacitor C3 through the switch S5. The one end of the capacitor C3 is connected to a ground GND, which provides a reference potential, through the switch 56. The other end of the capacitor C3 is connected to an output terminal of the operational amplifier 6 through the switch 7 and to the ground GND through the switch S8.

The switches S1 to S8 may be MOS transistors, for example, the on-off state of which is controlled by an operation control part 8. The switches S1, S4, S6 and S8 (referred to as switch group A below) and the switches S2, S3, S5 and S7 (referred to as switch group B below) are turned on and off complementarily so that, when one of the switch groups A and B is ON, the other of the switch groups A and B is OFF. In this description, turning on and off complementarily does not exclude a case, in which both switch groups A and B are tuned off as a dead time. In such configuration as described above, the high common mode voltage superimposed on the battery cell 2 is applied to the capacitor C2 and circuit elements, which are arranged at the battery pack side in a manner to sandwich the capacitor C2. As a result, the capacitor C2 and the circuit elements sandwiching the capacitor C2 must have sufficiently high withstanding voltages but other circuit elements may have low withstanding voltages. However, the capacitor C3 may also have a high withstanding voltage to be paired with the capacitor C2.

Figure 3:
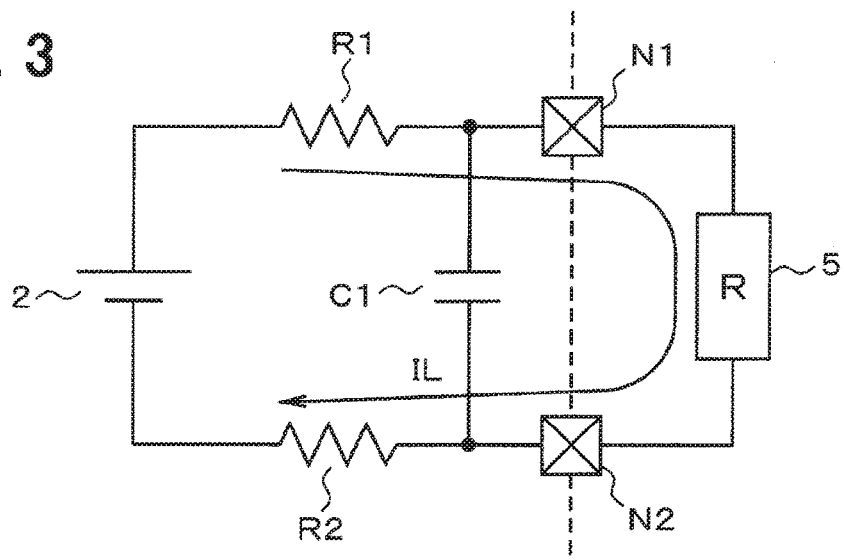
FIG. 3 is a circuit diagram equivalently showing a battery cell, a filter and the differential voltage detecting circuit.

When the differential voltage detecting circuit 5 configured as described above operates, currents leak from the input node N1 side and the input node N2 side. That is, leak currents are taken out from the battery cell 2. This is because the capacitor C2 is charged and discharged in repetition at a predetermined time period T in the differential voltage detecting circuit 5. For this reason, as shown in FIG. 3, it is assumed equivalently that a resistance R is connected between the input nodes N1 and N2 and a leak current IL is taken out from the battery cell 2. The resistance R is expressed as the following equation (1), in which C2 indicates a capacitance of the capacitor C2.

$$R=T/C2 \tag{1}$$

When the leak current IL flows in the resistors R1 and R2 of the filter 3, a voltage drops and the differential voltage ΔVi is detected with error.

Figure 4:
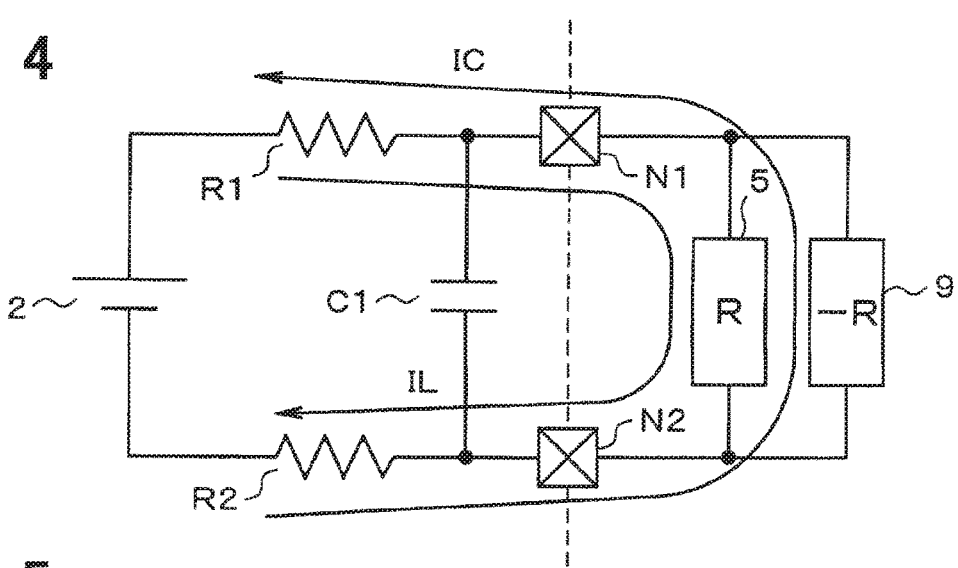
FIG. 4 is a circuit diagram equivalently showing the battery cell, the filter, the differential voltage detecting circuit and a leak canceling circuit.

The voltage detecting device 1 includes a leak canceling circuit 9 to decrease the detection error caused by the leak current IL. As shown in FIG. 4, the leak canceling circuit 9 operates like a negative resistor −R, which is connected between the input nodes N1 and N2. For this reason, a compensating current IC flows in a direction opposite to that of the leak current IL so that the leak current IL is cancelled out.

The leak canceling circuit 9 is connected in parallel with the differential voltage detecting circuit 5 relative to the input nodes N1 and N2. The leak canceling circuit 9 causes the compensating current IC to cancel out the leak current, which leaks from the input nodes N1 and N2 side. As shown in detail in FIG. 2, the leak canceling circuit 9 may have a single-end configuration, which includes an operational amplifier 10, resistors R3, R4, a capacitor C4 and switches S9 to S12.

The operational amplifier 10 forms an inverting amplifier jointly with the resistors R3 and R4 to invert the detection voltage VOUT outputted from the differential voltage detecting circuit 5 and output a voltage by amplifying the inverted detection voltage. One end of the capacitor C4 is connected to the input node N1 through the switch S9 and to the input node N2 through the switch S10. The other end of the capacitor C4 is connected to an output terminal of the operational amplifier 10 through the switch S11 and to an inverting input terminal of the operational amplifier 10 through the switch S12 and the resistor R3. A non-inverting input terminal of the operational amplifier 10 is connected to the ground GND. The resistor R4 is connected between the inverting input terminal and the output terminal of the operational amplifier 10. The detection voltage VOUT outputted from the differential voltage detecting circuit 5 is inputted to the inverting input terminal of the operational amplifier 10 through the resistor R3. With the configuration described above, the leak canceling circuit 9 generates the compensating current IC, which varies with the detection voltage VOUT outputted from the differential voltage detecting circuit 5.

Each of the switches S9 to S12 is formed of, for example, a MOS transistor and controlled to turn on and off by the operation control part 8. The switches S9 and S12 (referred to as a switch group C below) and the switches S10 and S11 (referred to as a switch group D below) are turned on and off complementarily. In such a configuration as described above, a high common mode voltage, which is superimposed on the battery cell 2, is applied to the capacitor C4 and circuit elements provided at the battery pack side while sandwiching the capacitor C4. For this reason, these circuit elements described above have high withstanding voltages and other circuit elements have low withstanding voltages.

The operation control part 8 controls operations of the differential voltage detecting circuit 5 and the leak canceling circuit 9. The operation control part 8 controls the leak canceling operation of the leak canceling circuit 9 to perform or stop its leak current canceling operation, that is, generation of the compensating current. The operation control part 8 controls the leak canceling circuit 9 to perform the leak canceling operation, when no operation command is applied from the diagnosing part 7. The operation control part 8 controls the leak current canceling circuit 9 to perform or stop the leak canceling operation when an operation command is applied from the diagnosing part 7.

In case of controlling the leak canceling circuit 9 to perform the leak canceling operation, the operation control part 8 controls switches S1 to S12 so that the on-off timings of the switch groups A and C coincide and the on-off timings of the switch groups B and D coincide. In case of controlling the leak canceling circuit 9 to stop the leak canceling operation, the operation control part 8 controls the on-off state of the switches S1 to S8 of the differential voltage detecting circuit 5 and turns off all the switches S9 to S12 of the leak canceling circuit 9. At this time, the operation control part 8 may turn off only the switches S9 and S10 or the switches S11 and S12.

The diagnosing part 7 performs failure diagnosis about the leak cancelling circuit 9 based on digital data indicating the value of the detection voltage VOUT outputted from the A/D converter 4. In the following description, the digital data is also referred to as a detection voltage value VOUT.

In the configuration described above, the detection voltage value VOUT, which is outputted when the leak canceling circuit 9 is not in operation, is expressed by the following equation (2). The detection voltage value VOUT, which is outputted when the leak canceling circuit 9 is in operation, is expressed by the following equation (3). Here, C3 is a capacitance value, RF is resistance values of the resistors R1, R2 and VBAT is a voltage value of the battery cell 2.

$$VOUT=(C2/C3)\times\{R/(2\times RF+R)\}\times VBAT \quad (2)$$

$$VOUT=(C2/C3)\times VBAT \quad (3)$$

In case that the leak canceling circuit 9 is normal without failure, the detection voltage value becomes the value expressed by the equation (2) when the operation command for stopping the leak canceling operation of the leak canceling circuit 9 is applied to the operation control part 8 and the value expressed by the equation (3) when the operation command for performing the leak canceling operation of the leak canceling circuit 9 is applied to the operation control part 8. These two values are different each other. However, in case that the leak canceling circuit 9 is not normal because of failure, both of the detection voltage values become the same as expressed by the equation (2) whether the operation command for stopping or performing the leak canceling operation of the leak canceling circuit 9 is applied to the operation control part 8.

Based on this characteristic point, the diagnosing part 7 performs a failure diagnosis about the leak canceling circuit 9 based on a difference between a first detection value Vd1 and a second detection value, which are the detection voltage values. The first detection value Vd1 is acquired when the operation command for performing the leak canceling operation of the leak canceling circuit 9 is applied to the operation control part 8. The second detection value Vd2 is acquired when the operation command for stopping the leak canceling operation of the leak canceling circuit 9 is applied to the operation control part 8. The diagnosing part 7 includes registers or the like for storing the first detection value Vd1 and the second detection value Vd2.

The diagnosing part 7 determines that the leak canceling circuit 9 is normal, when a differential voltage $\Delta Vd$ (=Vd1-Vd2) calculated by subtracting the second detection value Vd2 from the first detection value Vd1 satisfies the following inequality relation (4). The diagnosing part 7 determines that the leak canceling circuit 9 is failing (not normal) when the differential voltage does not satisfy the following inequality relation (4). Here, LL and UL are lower limit reference value and an upper limit reference value to be used in the failure diagnosis, respectively. Both of these limit values are positive values.

$$LL \leq \Delta Vd \leq UL \quad (4)$$

That is, the diagnosing part 7 determines that the leak canceling circuit 9 is failing when the differential voltage $\Delta Vd$ is smaller than the lower limit reference value LL and is larger than the upper limit reference value UL. In this case, the diagnosis using the upper limit value UL may be omitted. That is, the diagnosing part 7 may determine that the leak canceling circuit 9 is failing when the differential voltage $\Delta Vd$ is smaller than the lower limit reference value L and the leak canceling circuit 9 is normal when the differential voltage $\Delta Vd$ is larger than the lower limit reference value LL.

The lower limit reference value LL and the upper limit reference value UL are set in view of the following points. That is, the difference between the detection voltage values, that is, the differential voltages $\Delta Vd$, which are provided at the time of performing the leak canceling operation and stopping the leak canceling operation of the leak canceling circuit 9 are not always constant. The difference $\Delta Vd$ varies with variations of the resistance value RF of the resistors R1, R2 of the RC filter 3, the capacitance value C2 of the capacitor C2, a period T of charging and discharging of the capacitor C2 and the like.

Figure 5:
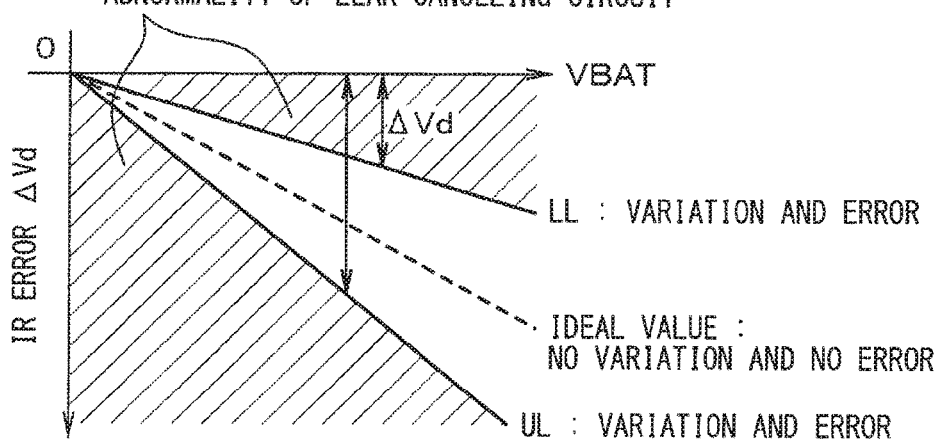
FIG. 5 is a graph showing a method of setting a lower limit reference value and an upper limit reference value for failure diagnosis.

In the first embodiment, accordingly, the lower limit reference value LL and the upper limit reference value UL are set as shown in FIG. 5. Specifically, a minimum value and a maximum value of the differential voltage $\Delta Vd$, which are estimated by taking into consideration of variations in such circuit constants described above when the leak canceling circuit 9 is normal, are set as the lower limit reference value LL and the upper limit reference value UL.

The failure diagnosis about the leak canceling circuit 9 is performed when the voltage detecting device 1 is activated and performed periodically at every elapse of a predetermined period after activation. Alternatively, the failure diagnosis may be made only at the time of activation of the voltage detecting device 1 or only periodically after the activation. In case that the failure diagnosis is performed periodically, the timing for performing the failure diagnosis is determined so that the failure diagnosis may be performed in one set with other diagnoses related to monitoring of the battery cell 2.

Figure 6:
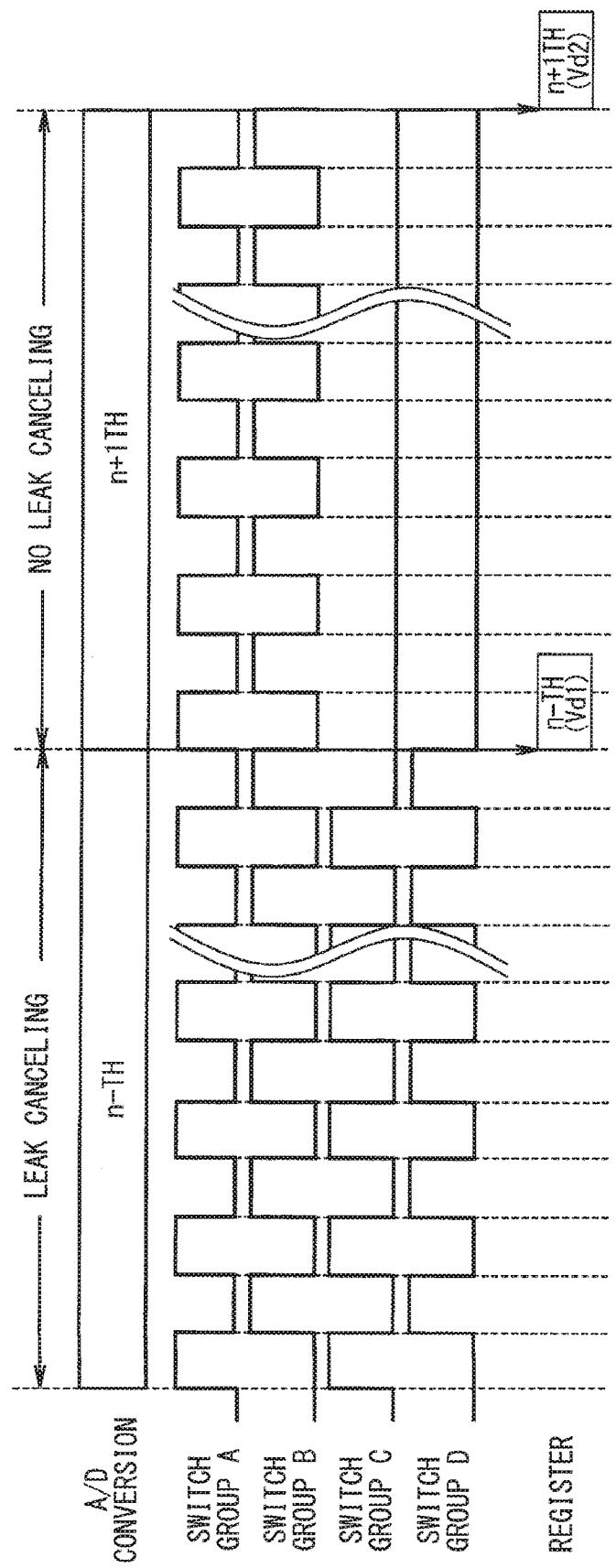
FIG. 6 is a time chart schematically showing an operation state of each part.

An operation of the first embodiment will be described next with reference to a timing chart of FIG. 6. After starting the failure diagnosis about the leak canceling circuit 9, the diagnosing part 7 applies the operation command to the operation control part 8 for controlling the leak canceling circuit 9 to perform the leak canceling operation. The operation control part 8 responsively controls the switches S1 to S12 so that the switch groups A and C turn on and off at the same timing and the switch groups B and D turn on and off at the same timing. Thus, the leak cancelling operation is performed in this period unless any failure is present. At this time, the A/D converter 4 executes n-th A/D conversion and the diagnosing part 7 stores in the register the digital data, which is provided as a result of the n-th A/D conversion, as the first detection value Vd1.

The diagnosing part 7 then applies the operation command to the operation control part 8 for controlling the leak canceling circuit 9 to stop the leak canceling operation. The operation control part 8 responsively controls the switches S1 to S8 so that the switch groups A and B turn on and off complementarily and turns off the switch groups C and D, that is, switches S9 to S12, continuously. Thus, the leak cancelling operation is not performed in this period whether any failure is present or not. At this time, the A/D converter 4 executes (n+1)-th A/D conversion and the diagnosing part 7 stores in the register the digital data, which is provided as a result of the (n+1)-th A/D conversion, as the second detection value Vd2.

Then the diagnosing part 7 calculates the differential voltage ΔVd by subtracting the second detection value Vd2 from the first detection value Vd1, which are stored in the registers. When the calculated value of the differential voltage ΔVd is smaller than the lower limit reference value LL or larger than the upper limit reference value UL, the diagnosing part 7 determines that the leak canceling circuit 9 is failing. When the calculated value of the differential voltage ΔVd is equal to or larger than the lower limit reference value LL but smaller than the upper limit reference value UL, the diagnosing part 7 determines that the leak canceling part 9 is normal.

The first embodiment described above provides the following advantages. In the first embodiment, the diagnosing part 7 performs the failure diagnosis about the leak canceling circuit 9 based on the differential voltage ΔVd, which is the difference between the first detection value Vd1 and the second detection value Vd2. The first detection value Vd1 is the detection voltage value in the period, in which the diagnosing part 7 applies the operation command to the leak canceling circuit 9 to perform the leak canceling operation. The second detection value Vd2 is the detection voltage value in the period, in which the failure diagnosing part 7 applies the operation command to the leak canceling circuit 9 to stop the leak canceling operation. This value of the differential voltage ΔVd varies between cases that the leak canceling circuit 9 is normal and the leak canceling circuit 9 is failing for the reason described above. For this reason, according to the first embodiment, it is possible to accurately diagnose whether the leak canceling circuit 9 is operating normally and hence the voltage of the battery cell 2 is detected more accurately.

The diagnosing part 7 is configured to determine that the leak canceling circuit 9 is failing not only when the value of the differential voltage ΔVd is smaller than the lower limit reference value LL but also when the value of the differential voltage ΔVd exceeds the upper limit reference value UL. When the leak canceling circuit 9 fails, the leak current IL is not canceled out and the detection voltage value tends to become smaller than the normally detected value in many cases. However, the compensating current Ic may become larger than the leak current IL in such a case that the operational amplifier 10 of the leak canceling circuit 9 fails or the switches S9 to S12 remain continuously fixed. In this case, the detection voltage value tends to become larger than the normally detected value. According to the first embodiment, it is possible to detect the failure of the leak canceling circuit 9 including such a case of failure.

The lower limit reference value LL and the upper limit reference value UL provided for the failure diagnosis are set taking into consideration of variations in the circuit constants and the like, which affects the differential voltage ΔVd. Accordingly, even when the differential voltage ΔVd varies with variations in the circuit constants or the like, it is possible to perform the failure diagnosis about the leak canceling circuit 9 with high accuracy based on the differential voltage ΔVd.

The failure diagnosis about the leak canceling circuit 9 is performed at the time of activating the voltage detecting device 1. It is accordingly possible to prevent the voltage detecting device 1 from starting to operate under the state that the leak canceling circuit 9 is failing. The failure diagnosis about the leak canceling circuit 9 is performed periodically after activation of the voltage detecting device 1. It is accordingly possible to detect the failure of the leak canceling circuit 9 even when the failure arises in the leak canceling circuit 9 after the voltage detecting device 1 started its operation. Hence it is possible to protect the voltage detecting device 1 from continuing Its operation under a state that the voltage of the battery cell 2 cannot be detected with high accuracy.

Second Embodiment

Figure 7:
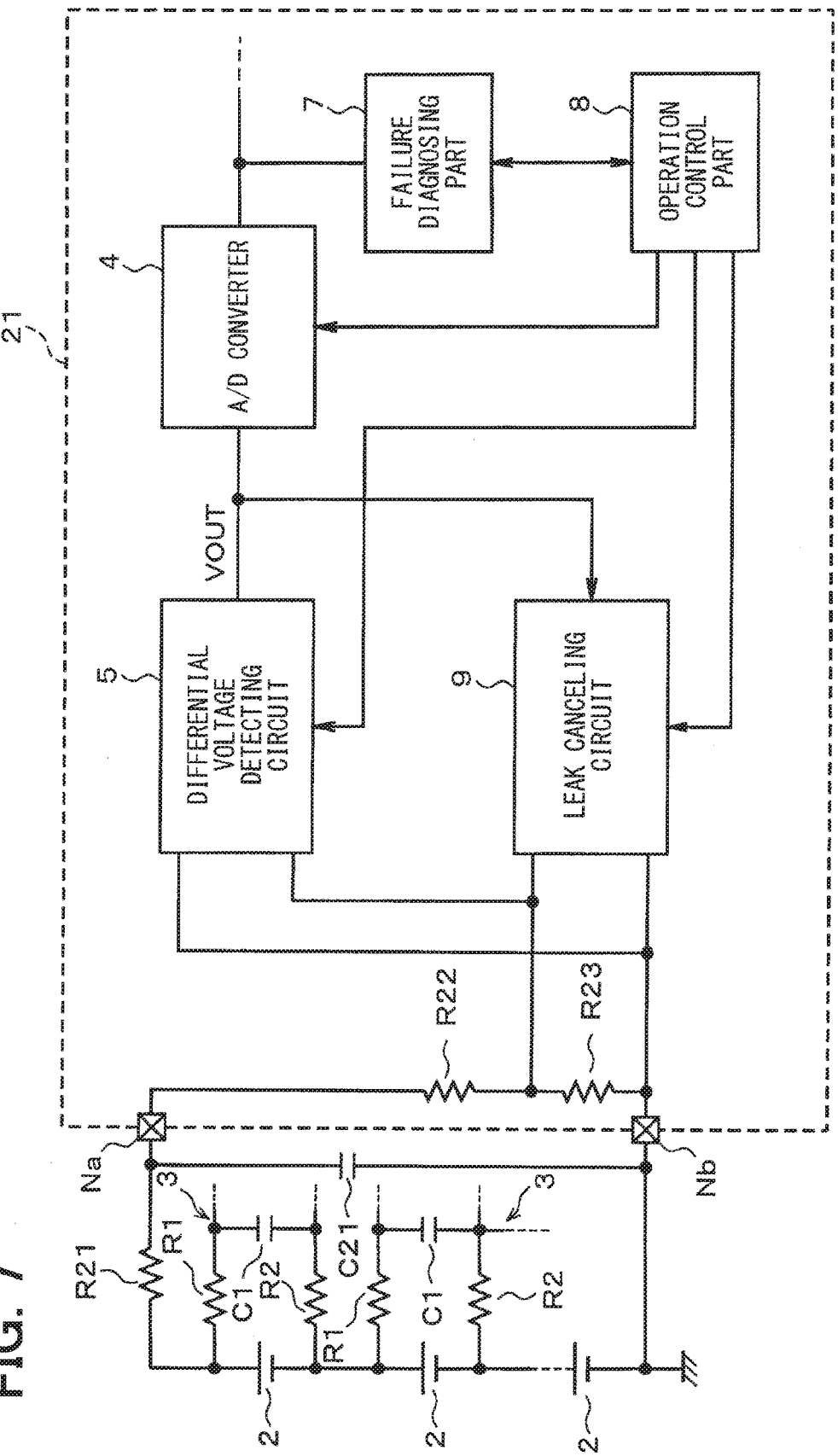
FIG. 7 is a block diagram schematically showing a general configuration of a voltage detecting device according to a second embodiment.

A second embodiment will be described below with reference to FIG. 7. As shown in FIG. 7, a voltage detecting device 21 has an input node Na and an input node Nb. The input node Na is connected to a high-potential side terminal of the battery cell 2, which is shown at the highest position of the battery pack in the figure, through a resistor R21. The input node Nb is connected to a low-potential side terminal of the battery cell 2, which is shown at the lowest position of the battery pack in the figure. A capacitor C21 is connected between the input nodes Na and Nb. The capacitor C21 forms an RC filter jointly with the resistor R21.

With this configuration described above, a voltage of a block, which is formed of a predetermined number of battery cells 2 is applied between the input nodes Na and Nb. This voltage is referred to as a block voltage. The voltage detecting device 21 includes a voltage dividing circuit, which is formed of resistors R22 and R23. The voltage dividing circuit is connected between the input nodes Na and Nb. The voltage detecting device 21 detects a differential voltage between the node Nb and a common junction of the resistors R22 and R23. That is, the voltage detecting device 21 is configured to detect the block voltage applied between the input nodes Na and Nb by voltage division.

The voltage detecting device 21 is provided with the failure diagnosing part 7, which performs failure diagnosis about the leak canceling circuit 9, in the similar manner as in the first embodiment. Accordingly, the second embodiment also provides the same advantages as the first embodiment. In the second embodiment, since the resistors R22 and R23 forming the voltage dividing circuit are provided in addition to the resistor R21 forming the RC filter, a voltage drop caused by the leak current, that is, a voltage detection error is likely to become larger than in the first embodiment.

As a result, a difference in detection voltages between the leak canceling operation and no leak canceling operation of the leak canceling circuit 9, that is, the differential voltage ΔVd between the first detection value Vd1 and the second detection value Vd2 also becomes large. According to the second embodiment, it is possible to accurately perform the failure diagnosis about the leak canceling circuit 9 without finely setting the lower limit reference value LL and the upper limit reference value UL in consideration of error factors.

Third Embodiment

Figure 8:
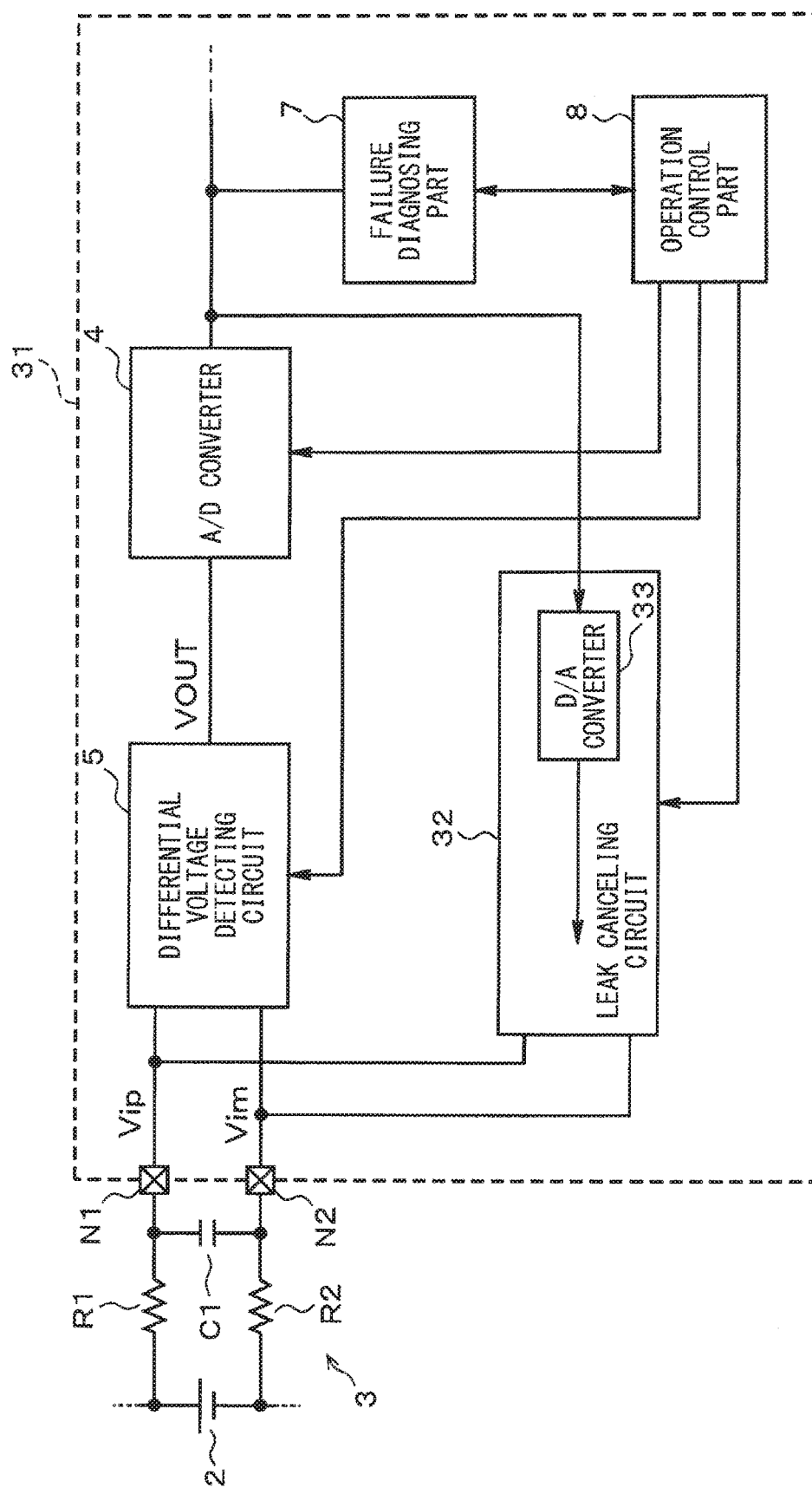
FIG. 8 is a block diagram schematically showing a general configuration of a voltage detecting device according to one example of a third embodiment.

A third embodiment will be described with reference to FIG. 8 and FIG. 9. As shown in FIG. 8, a voltage detecting device 31 is different from the voltage detecting device 1 in that a leak canceling circuit 32 is provided in place of the leak canceling circuit 9. The leak canceling circuit 32 is configured to include a D/A converter 33 and generates a compensating current, which varies with the detection voltage VOUT, by using an analog voltage, which results from D/A conversion of the digital data outputted from the A/D converter 4.

The failure diagnosing part 7 provided in the voltage detecting device 31 performs failure diagnosis about the leak canceling circuit 9 in the similar manner as in the first embodiment. In this case, as shown in FIG. 9, the diagnosing part 7 is enabled to individually diagnose whether the D/A converter 33 is falling in addition to the failure diagnosis about the entirety of the leak canceling circuit 32 by only adding a switch S31.

Figure 9:
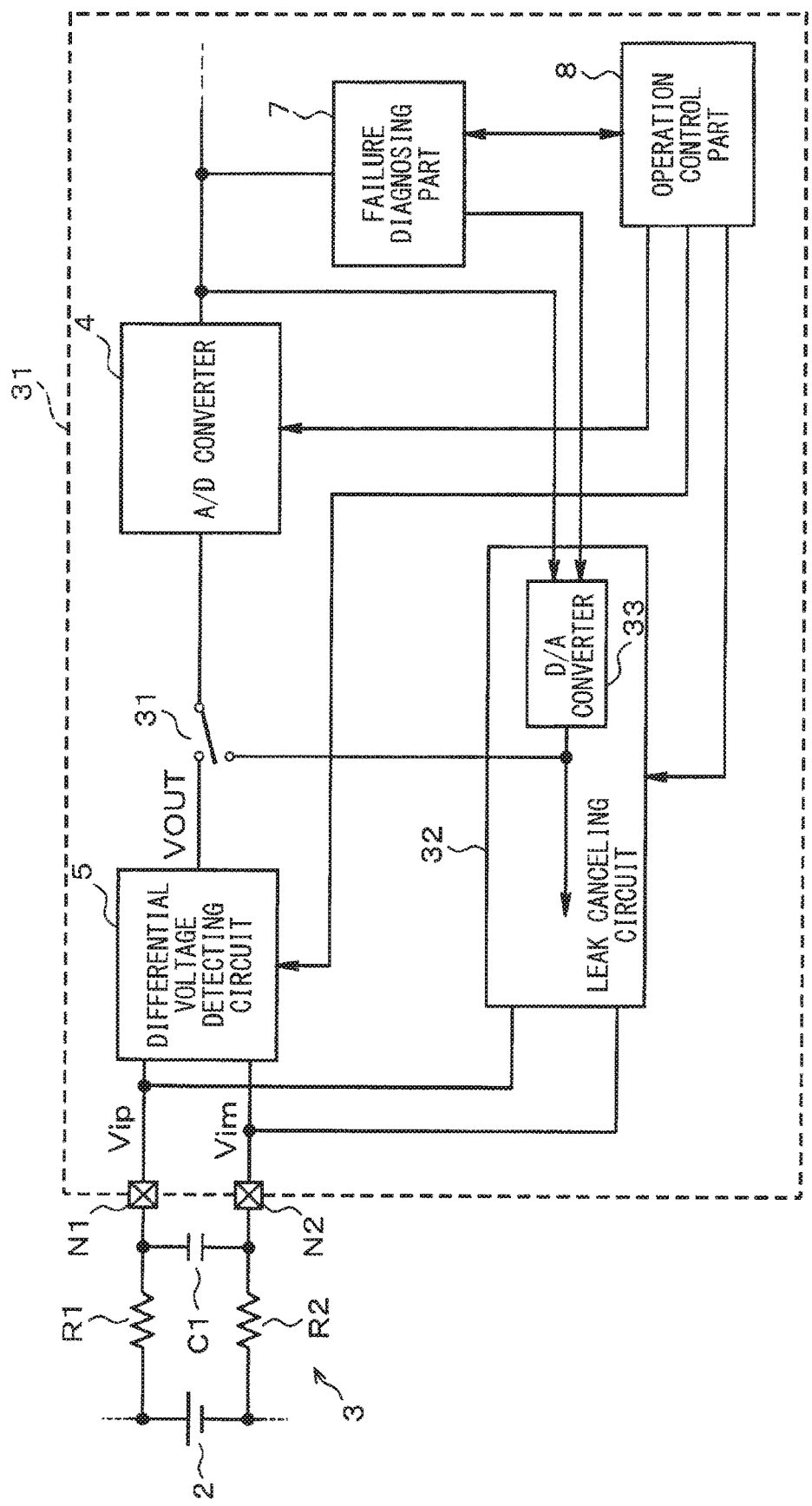
FIG. 9 is a block diagram schematically showing a general configuration of a voltage detecting device according to a further example of the third embodiment.

As shown in FIG. 9, the switch S31 is provided to switch over the application of the detection voltage VOUT and the application of the output voltage of the D/A converter 33 to the A/D converter 4. That is, the switch S31 operates as a switchover part, which selectively apply either one of the detection voltage VOUT and the analog voltage outputted from the D/A converter 33. The switch S31 is controlled by the operation control part 8.

The switch S31 is switched over to the detection voltage VOUT side in normal operation time and in failure diagnosis time for the entire leak cancel circuit 9. In this case, the diagnosing part 7 has a function of inputting a predetermined test data to the D/A converter 33 in place of the digital data outputted from the A/D converter 4. That is, the diagnosing part 7 operates as a test data input part as well.

A failure diagnosis about the D/A converter 33 by the diagnosing part 7 will be described next. After starting the failure diagnosis about the D/A converter 33, the diagnosing part 7 stops operations of the differential voltage detecting circuit 5 and the leak canceling circuit 32 through the operation control part 8 and switches over the switch S31 to the D/A converter 33 side. The diagnosing part 7 then outputs either one of digital data stored in the register as the test data to the D/A converter 33. The test data may be predetermined to any value.

Thus, the analog voltage corresponding to the test data is outputted from the D/A converter 33 and applied to the A/D converter through the switch 31 to be converted into the digital data by the A/D converter 4. The diagnosing part 7 compares the digital data outputted from the A/D converter 4 at this moment with the test data outputted to the D/A converter 33. These data coincide as far as the D/A converter 33 is normal. The diagnosing part 7 accordingly determines that the D/A converter 33 is normal when the compared data coincide. The diagnosing part 7 determines that the D/A converter 33 is failing when the compared data do not coincide.

This failure diagnosis about the D/A converter 33 may be performed separately. Alternatively, it may be performed when the leak canceling circuit 32 is determined to be falling as a result of failure diagnosis about the entire leak cancel circuit 32, which is performed in the similar manner as in the first embodiment.

Accordingly, the third embodiment described above provides the same advantage as the first embodiment. According to the third embodiment, it is possible to not only diagnose the failure of the entire leak cancel circuit 32 but also diagnose individually whether the D/A converter 33 provided in the leak canceling circuit 32 is failing. By performing the failure diagnosis about the D/A converter 33 when the leak canceling circuit 32 is determined to be failing as a result of the failure diagnosis about the entire leak cancel circuit 32, it is possible to specify the location of the failure and take necessary actions to counter the failure easily.

Fourth Embodiment

Figure 10:
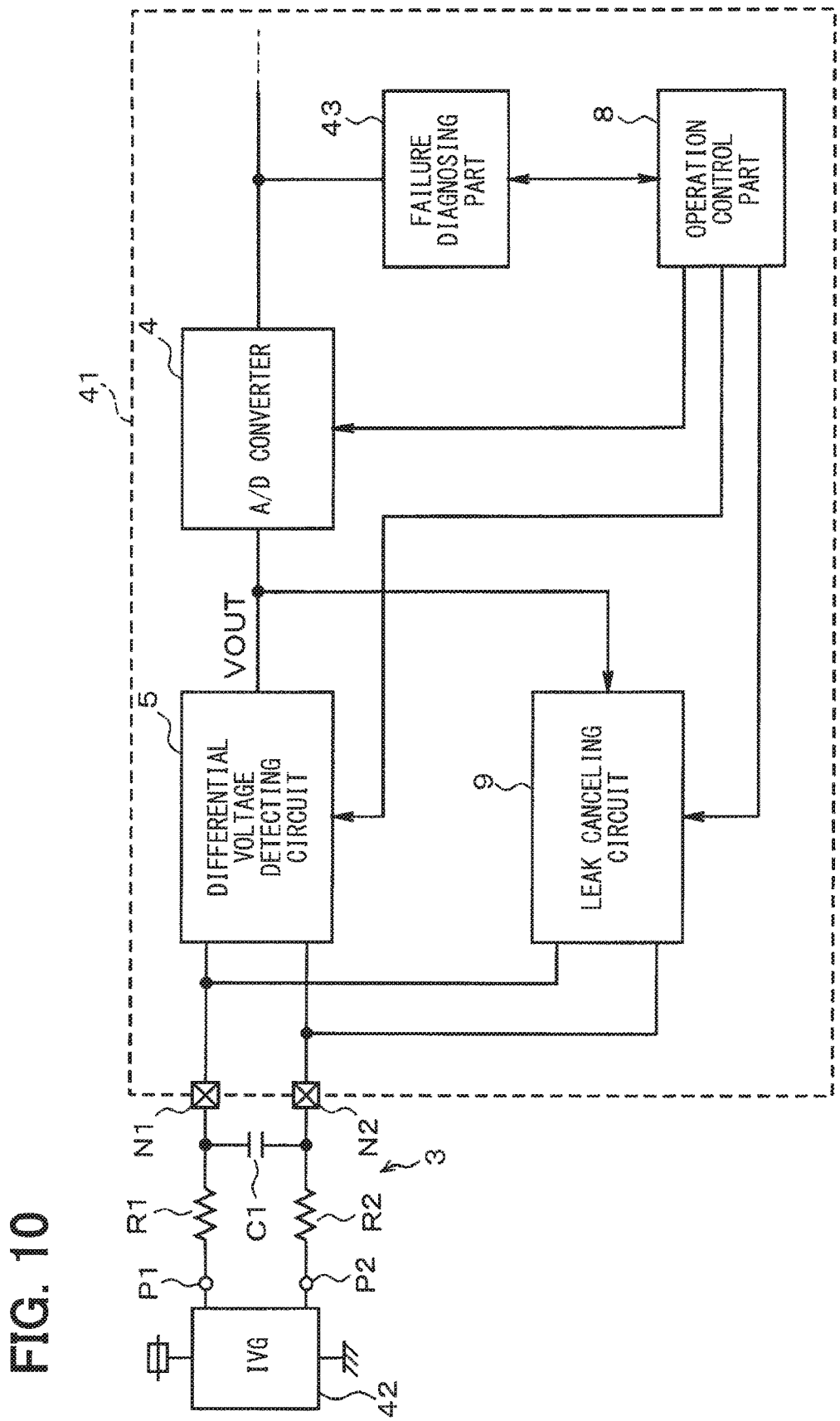
FIG. 10 is a block diagram schematically showing a general configuration of a voltage detecting device according to a fourth embodiment.

A fourth embodiment will be described next with reference to FIG. 10. As shown in FIG. 10, a voltage detecting device 41 is configured to switch over a connection state between a state, in which the battery cell 2 is connected between the input nodes N1 and N2 through the RC filter 3, and a state, in which an inspection voltage generator (IVG) 42 for generating a predetermined inspection voltage is connected through the RC filter 3. This switchover is enabled by providing connection terminals P1 and P2, which are capable of selectively connecting the battery cell 2 and the inspection voltage generator 42. The connecting terminals P1 and P2 thus operate as an inspection voltage applying part, which applies the predetermined inspection voltage between the input nodes N1 and N2.

The inspection voltage generator 42 is configured to output the inspection voltage by dividing a power supply voltage provided outside an integrated circuit (IC) by a voltage dividing circuit. Alternatively, the inspection voltage generator 42 may be configured to output the inspection voltage by dividing the power supply voltage provided inside the IC by a voltage dividing circuit provided outside the IC or may be configured to output the inspection voltage by dividing the power supply voltage provided inside the IC by a voltage dividing circuit provided inside the IC.

The value of the inspection voltage outputted from the inspection voltage generator 42 is pre-stored in a failure diagnosing part 43. The failure diagnosing part 43 may alternatively pre-store a voltage value of the power supply forming the inspection voltage generator 42 and a voltage dividing ratio of the voltage dividing circuit in place of the inspection voltage value. In this case as well, the failure diagnosing part 43 determines the inspection voltage by calculation using the pre-stored voltage value and the voltage dividing ratio.

The failure diagnosing part 43 performs the failure diagnosis about the leak canceling circuit 9 based on the detection voltage value in the period of application of the inspection voltage between the input nodes N1 and N2. The failure diagnosing part 43 performs the failure diagnosis described above by generating an operation command to the operation control part 8 to control the leak canceling circuit 9 to perform the leak canceling operation.

In the configuration described above, when the leak canceling circuit 9 is normal, the detection voltage value is a value (referred to as an ideal value below), which is close to the predetermined inspection voltage. When the leak canceling circuit 9 is failing, the detection voltage value is not the ideal value but is a value, which includes an error arising from the leak current.

Based on this point, the failure diagnosing part 43 determines that the leak canceling circuit 9 is normal when the detection voltage value in the period of application of the inspection voltage between the input nodes N1 and N2 is the ideal value. The failure diagnosing part 43 determines that the leak canceling circuit 9 is failing when the detection voltage value is different from the ideal value. The failure diagnosing part 43 may determine that the leak canceling circuit 9 is normal when the detection voltage value is in a predetermined range including the ideal value and that the leak canceling circuit 9 is failing when the detection voltage value is outside the predetermined range.

According to the fourth embodiment, it is possible to accurately diagnose whether the leak canceling circuit 9 operates normally and hence Improve the accuracy of voltage detection. Further, since the failure diagnosis is performed by using the predetermined inspection voltage, it is possible to further improve the accuracy of diagnosis.

Fifth Embodiment

Figure 11:
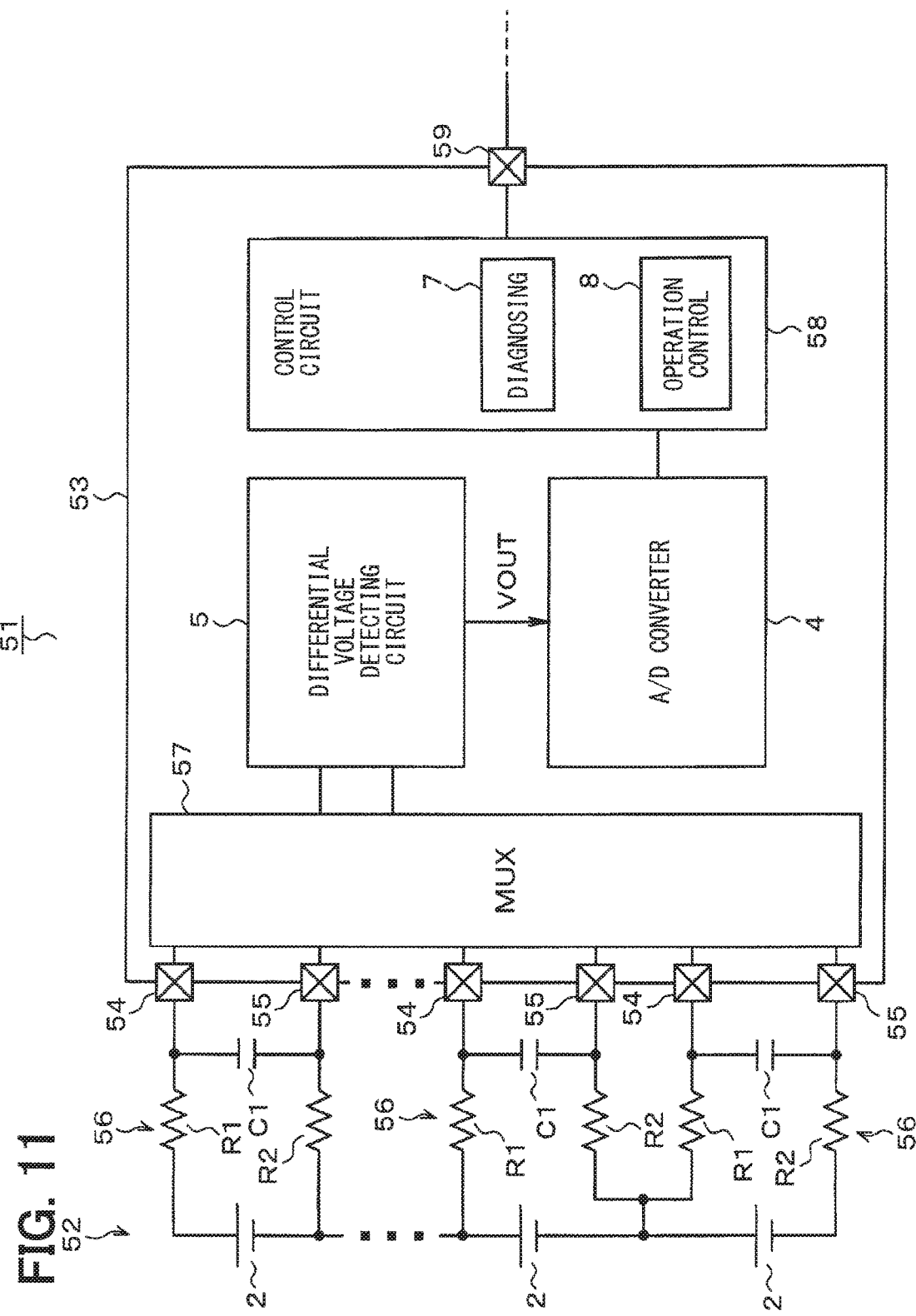
FIG. 11 is a block diagram schematically showing a general configuration of a battery pack monitoring system.

A fifth embodiment will be described below with reference to FIG. 11. As shown in FIG. 11, a battery pack monitoring system 51 is configured to monitor a voltage of each battery cell 2 forming a battery pack 52. The battery pack 52 is formed of a number of battery cells 2 such as secondary batteries and fuel cells, which are connected serially in multiple stages.

A battery monitoring IC 53 includes plural connecting terminals 54 provided in correspondence to high-potential side terminals of the battery cells 2 and plural connecting terminals 55 provided in correspondence to low-potential side terminals of the battery cells 2. Each set of the connecting terminals 54 and 55 corresponds to a set of input nodes N1 and N2, which are shown in FIG. 1. Each battery cell 2 and each set of the connecting terminals 54 and 55 are connected through a filter 56 provided to filter out noises. The filter 56 corresponds to the filter 3 shown in FIG. 1.

A multiplexer 57 is formed of plural switch circuits to select either one of plural sets of the connecting terminals 54 and 55 to connect the selected set to the differential voltage detecting circuit 5. The differential voltage detecting circuit 5 samples each voltage of the connecting terminals 54 and 55 selected and connected through the multiplexer 57 and detects the differential voltage between the terminals of the battery cell 2 corresponding to the selected set of the connecting terminals 54 and 55. That is, the battery monitoring IC 53 is configured to detect voltages of plural battery cells 2 by one differential voltage detecting circuit 5 in a time-divided manner. The differential voltage detecting circuit 5 outputs the detection voltage VOUT, which indicates the detected differential voltage, to the A/D converter 4.

The A/D converter 4 converts the detection voltage VOUT supplied from the differential voltage detecting circuit 5 to a digital data (referred to as a voltage data). The A/D converter 4 is preferably a high-precision type such as the $\Delta\Sigma$ type thereby to detect the voltage of the battery cell 2 with high accuracy. For this reason, the differential voltage detecting circuit 5 performs an over-sampling operation to sample an input signal at a frequency, which is sufficiently higher than a target sampling frequency.

Although not shown in the figure, an equalizing switch or the like, which performs equalizing processing for equalizing the voltages of the battery cells 2, is connected between each set of the connecting terminals 54 and 55 and the multiplexer 57.

A control circuit 58 is configured to control operations of the multiplexer 57, the differential voltage detecting circuit 5, the A/D converter 4, the equalizing switch and the like. The control circuit 58 includes the diagnosing part 7 and the operation control part 8 shown in FIG. 1. The voltage data outputted from the A/D converter 4 is applied to the control circuit 58. The control circuit 58 includes a communication interface for communication with an upper-level control device, which is not shown. The control circuit 58 transmits the voltage data of each battery cell 2 from an output terminal to the upper-level control device through a communication network.

As described in the background section, when the detection method by over-sampling is used in a voltage detection system having a high input impedance because of the RC filter provided at the input stage, the leak current remarkably causes the detection error. Even in such a case, it is possible to suppress generation of voltage detection error arising from the leak current and maintain the voltage detection accuracy at high level by the differential voltage detecting circuit 5 while suppressing increases in a circuit area and current consumption.

Other Embodiment

The voltage detecting device 1, 21, 31, 41 and the battery pack monitoring system 51 described is not limited to the embodiments described above and shown in the drawings but may be implemented in different embodiments. In each embodiment described above, the voltage detecting device is exemplified as applications for detecting the differential voltage of the battery cell 2 forming the battery pack. However, the voltage detecting device may be exemplified as any applications for detecting the differential voltage between two input nodes having non-zero common mode voltage.

Figure 12:
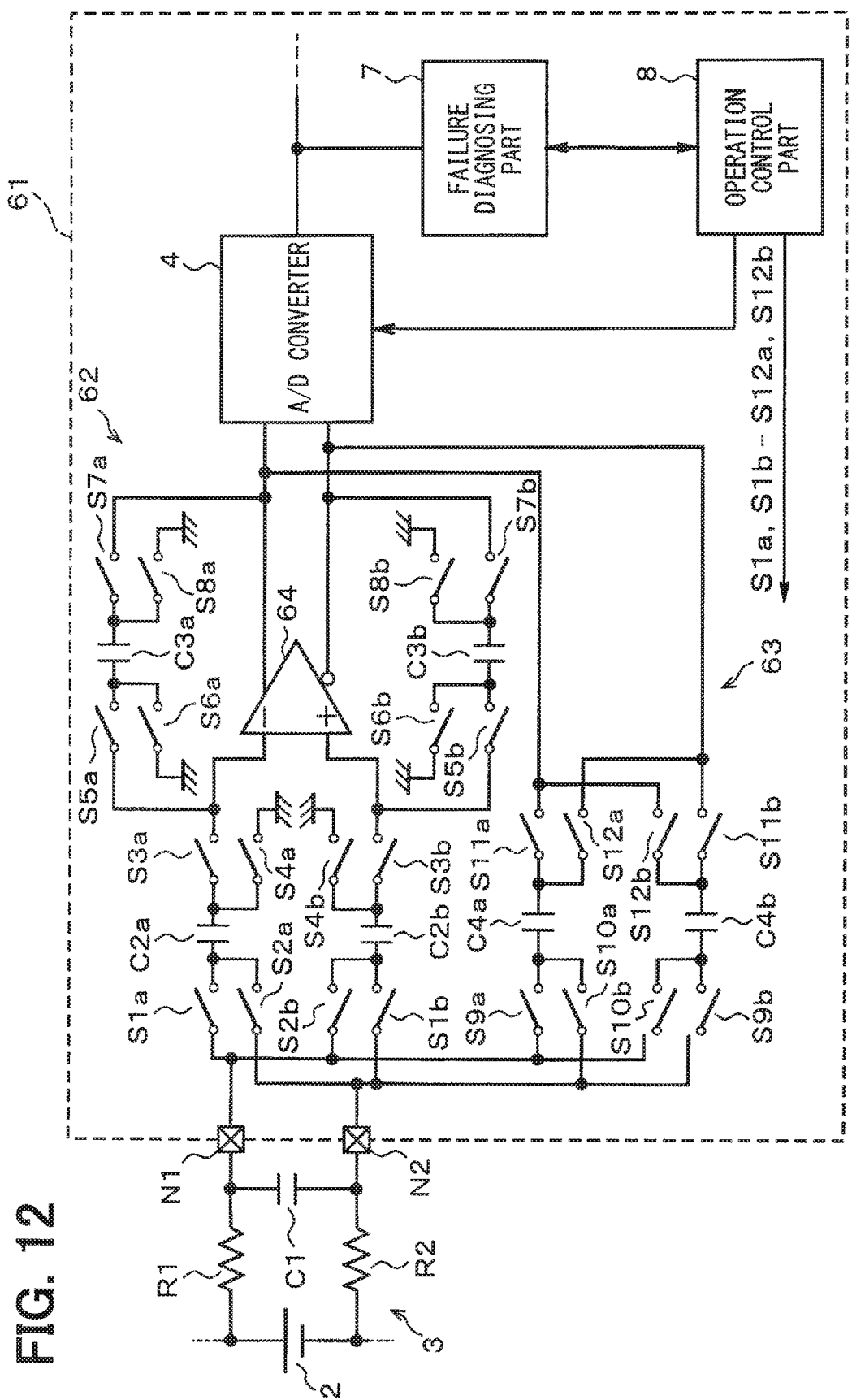
FIG. 12 is a circuit diagram showing a detailed configuration of a differential voltage detecting circuit and a leak canceling circuit.

Although the differential voltage detecting circuit 5 and the leak canceling circuits 9, 32 are configured in the single end structure in the embodiments described above, these circuits may be configured differently. For example, as shown in FIG. 12, a voltage detecting device 61 may be configured to include a differential voltage detecting circuit 62 and a leak canceling circuit 63, which are both in differential structure. In this configuration, the differential voltage detecting circuit 62 is provided with an operational amplifier 64 of a differential output type. In the operational amplifier 64, one circuit side for an inverting input terminal and a non-inverting output terminal and the other circuit side for a non-inverting input terminal and an inverting output terminal are configured symmetrically. In FIG. 12, structural components provided for the one circuit side for the inverting input terminal and the non-inverting output terminal are designated with "a" attached to reference numerals and structural components provided for the other circuit side for the non-inverting input terminal and the inverting output terminal are designated with "b" attached to reference numerals.

In the failure diagnosis by the failure diagnosing part 7, the timings for acquiring and storing the first detection value Vd1 and the second detection value Vd2 may be exchanged. That is, the second detection value Vd2 may be acquired and stored first and then the first detection value Vd1 may be acquired and stored.

Acquisition of each of the first detection value Vd1 and the second detection value Vd2 is not limited to only one A/D conversion result but may be acquired as an average value or an integrated value of plural times of A/D conversions. The failure diagnosing parts 7 and 43 may be realized by the control circuit 58 or the like provided inside the IC or by other hardware provided outside the IC or software.

What is claimed is:

1. A voltage detecting device for detecting a differential voltage between two input nodes having a common mode voltage, which is not zero, the voltage detecting device comprising:
   a differential voltage detecting circuit for detecting the differential voltage by sampling each voltage of the two input nodes and for outputting a detection voltage indicating a detection result;
   a leak canceling circuit for generating a compensating current, which flows in an opposite direction to a leak current leaking from two input node sides due to an operation of the differential voltage detecting circuit;
   an operation control part for controlling the leak cancelling circuit to perform or stop a leak cancelling operation; and
   a failure diagnosing part for performing a failure diagnosis about the leak canceling circuit based on a difference between a first detection value and a second detection value, the first detection value and the second detection value indicating values of the detection voltages detected in periods, during which the leak canceling circuit is controlled to perform and stop the leak canceling operation, respectively.

2. The voltage detecting device according to claim 1, wherein:
   the failure diagnosing part determines that the leak canceling circuit is falling when the difference between the first detection value and the second detection value is smaller than a predetermined lower limit reference value.

3. The voltage detecting device according to claim 2, wherein:
   the failure diagnosing part determines that the leak canceling circuit is failing when the difference between the first detection value and the second detection value is larger than a predetermined upper limit reference value larger than the lower limit reference value.

4. The voltage detecting device according to claim 1, further comprising:
   an inspection voltage application part for applying a predetermined inspection voltage between the input nodes to be detected as the differential voltage by the differential voltage detecting circuit,
   wherein the failure diagnosing part performs the failure diagnosis about the leak canceling circuit based on a value of the detection voltage detected in a period, during which the inspection voltage is applied between the input nodes with the leak canceling circuit being controlled to perform the leak canceling operation by the operation control part.

5. The voltage detecting device according to claim 4, wherein:
   the failure diagnosing part determines that the leak canceling circuit is falling when the value of the detection voltage is outside a predetermined range, which is determined based on a voltage value of the inspection voltage.

6. The voltage detecting device according to claim 1, wherein:
   the failure diagnosing part performs the failure diagnosis at time of activation of the voltage detecting device.

7. The voltage detecting device according to claim 1, wherein:
   the failure diagnosing part repeats the failure diagnosis at every elapse of a predetermined period after activation of the voltage detecting device.

8. A battery pack monitoring system for monitoring a voltage of each battery cell forming a battery pack, the battery pack monitoring system comprising:
   the voltage detecting device according to claim 1; and
   a filter provided between two terminals of the each battery cell and the two input nodes of the voltage detecting device; and
   an A/D converter for converting the detection voltage outputted from the differential voltage detecting circuit into digital data,
   wherein the voltage detecting device detects the differential voltage of each battery cell by oversampling detection method.

9. The voltage detecting device according to claim 8, wherein:
   the voltage detecting device detects the differential voltage of either one of battery cells.

10. The voltage detecting device according to claim 1, wherein:
    the voltage detecting device detects a voltage of a block of a predetermined number of battery cells.

11. The voltage detecting device according to claim 1, wherein:
    the leak canceling circuit includes a D/A converter for converting the digital data outputted from the A/D converter into an analog voltage and generates the compensating current by using the analog voltage;
    a switchover part for selectively applying either one of the detected voltage and the analog voltage to the A/D converter; and
    a test data inputting part for inputting predetermined test data to the D/A converter in place of the digital data;
    the failure diagnosing part performs a failure diagnosis about the D/A converter based on the digital data when the predetermined test data is inputted to the D/A converter and the analog voltage is inputted to the A/D converter by the switchover part.

12. A voltage detecting device for detecting a differential voltage between two input nodes having a common mode voltage, which is not zero, the voltage detecting device comprising:
    a differential voltage detecting circuit for detecting the differential voltage by sampling each voltage of the two input nodes and for outputting a detection voltage indicating a detection result;
    a leak canceling circuit for generating a compensating current, which flows in an opposite direction to a leak current leaking from two input node sides due to an operation of the differential voltage detecting circuit;
    an inspection voltage application part for applying a predetermined inspection voltage between the input nodes; and
    a failure diagnosing part for performing a failure diagnosis about the leak canceling circuit based on a value of the detection voltage detected in a period, during which the inspection voltage is applied between the input nodes.

\* \* \* \* \*